US008704602B2

(12) United States Patent
Miyanaga et al.

(10) Patent No.: US 8,704,602 B2
(45) Date of Patent: *Apr. 22, 2014

(54) TWO-POINT MODULATION DEVICE USING VOLTAGE CONTROLLED OSCILLATOR, AND CALIBRATION METHOD

(75) Inventors: Kenji Miyanaga, Kanagawa (JP); Takayuki Tsukizawa, Kanagawa (JP)

(73) Assignee: Panasonic Corporation, Osaka (JP)

( * ) Notice: Subject to any disclaimer, the term of this patent is extended or adjusted under 35 U.S.C. 154(b) by 129 days.

This patent is subject to a terminal disclaimer.

(21) Appl. No.: 13/389,290

(22) PCT Filed: Jun. 16, 2010

(86) PCT No.: PCT/JP2010/004014
§ 371 (c)(1),
(2), (4) Date: Feb. 7, 2012

(87) PCT Pub. No.: WO2011/018874
PCT Pub. Date: Feb. 17, 2011

(65) Prior Publication Data
US 2012/0133403 A1 May 31, 2012

(30) Foreign Application Priority Data
Aug. 12, 2009 (JP) .................. 2009-187463

(51) Int. Cl.
*H03B 5/10* (2006.01)
(52) U.S. Cl.
USPC ............... 331/16; 331/1 A; 331/175; 331/34; 331/177 R; 327/156; 375/376
(58) Field of Classification Search
USPC .............. 331/1 A, 16, 34, 175; 327/158, 156; 375/376
See application file for complete search history.

(56) References Cited

U.S. PATENT DOCUMENTS

| 7,061,341 | B1 | 6/2006 | Groe |
| 7,902,891 | B1 * | 3/2011 | Miyanaga et al. ............ 327/158 |
| 2005/0242889 | A1 | 11/2005 | Mitani et al. |
| 2006/0197605 | A1 | 9/2006 | Hirano et al. |

FOREIGN PATENT DOCUMENTS

| JP | 2005-72875 | 3/2005 |
| JP | 2005-304004 | 10/2005 |

OTHER PUBLICATIONS

International Search Report issued Sep. 21, 2010 in corresponding International Application No. PCT/JP2010/004014.

* cited by examiner

*Primary Examiner* — Arnold Kinkead
(74) *Attorney, Agent, or Firm* — Wenderoth, Lind & Ponack, L.L.P.

(57) ABSTRACT

A modulation section including a feedback circuit configured to conduct feedback control of an output signal from a voltage controlled oscillator based on an inputted modulation signal, and a feed-forward circuit configured to calibrate the modulation signal and outputting the calibrated modulation signal to the voltage controlled oscillator; a signal output section configured to output, to the modulation section, a predetermined reference signal instead of the modulation signal when a calibration is conducted; and a gain correction section configured to, in a state where the feedback circuit is forming an open loop, calculate a frequency transition amount of the reference signal outputted by the voltage controlled oscillator, and correct a gain used for calibrating the modulation signal at the feed-forward circuit based on the calculated frequency transition amount.

12 Claims, 15 Drawing Sheets

| CHANNEL FREQUENCY f | CORRECTED GAIN VALUE G |
|---|---|
| fa | Ga |
| fb | Gb |
| fc | Gc |
| ... | ... |

FIG. 6

| CHANNEL FREQUENCY f | CORRECTED GAIN VALUE G | | | | | | | | |
|---|---|---|---|---|---|---|---|---|---|
| | -A1 | +A1 | -A2 | +A2 | -A3 | +A3 | -A4 | +A4 |
| fa | Ga2 | Ga3 | Ga4 | Ga5 | Ga6 | Ga7 | Ga8 | Ga9 |
| fb | Gb2 | Gb3 | Gb4 | Gb5 | Gb6 | Gb7 | Gb8 | Gb9 |
| fc | Gc2 | Gc3 | Gc4 | Gc5 | Gc6 | Gc7 | Gc8 | Gc9 |
| ... | | | | | ... | | | |

FIG. 9

TWO-POINT MODULATION DEVICE USING VOLTAGE CONTROLLED OSCILLATOR, AND CALIBRATION METHOD

TECHNICAL FIELD

The present invention relates to a two-point modulation device using a voltage controlled oscillator, and a calibration method; and more specifically, relates to a two-point modulation device for calibrating nonlinearity and gain of a voltage controlled oscillator, and a calibration method conducted in the two-point modulation device.

BACKGROUND ART

As it is well-known, a voltage controlled oscillator (hereinafter, referred to as a VCO) is widely used in a modulator in a wireless radio as a device for generating local oscillation signals. Frequency modulation signals and phase modulation signals can be generated by using the VCO. Furthermore, modulation signals (phase shift keying (PSK), code division multiplex access (CDMA), orthogonal frequency division multiplex (OFDM), etc.) that also have modulation components in amplitude components can be generated, by controlling the voltage supplied to a power amplifier while having constant envelope modulation signals generated by the VCO to be inputted into the power amplifier. In recent years, in order to adapt such a modulation device to a communication system that uses multiple different frequency bands, it is necessary to adjust oscillation frequencies of the VCO in a broad frequency range.

Therefore, in order to achieve broadening of bandwidth for a modulation device, a modulation method called two-point modulation has been proposed. FIG. 11 shows a configuration example of a modulation device that uses a conventional two-point modulation method.

In FIG. 11, a conventional two-point modulation device 501 includes a calculation section 521, a frequency error calculation section 522, a loop filter 523, an addition section 525, a VCO 526, a frequency detection section 527, and a buffer 528.

A modulation signal is converted at the calculation section 521 into a signal that corresponds to a desired frequency channel, and is outputted as a low pass response signal via the frequency error calculation section 522 and the loop filter 523. Furthermore, a modulation signal is adjusted to be a signal that is necessary for the buffer 528, and is outputted as a high pass response signal. The addition section 525 adds the low pass response signal and the high pass response signal, and inputs the result into the VCO 526. A signal outputted by the VCO 526 is inputted, as a feedback, into the frequency error calculation section 522 via the frequency detection section 527. The frequency error calculation section 522 detects and outputs a frequency error between a modulation signal outputted from the calculation section 521 and a signal outputted from the frequency detection section 527. With such feedback processing, the frequency of the signal outputted by the VCO 526 becomes stable.

As described above, by using the two-point modulation method, broadening of the bandwidth for a modulation device can be achieved (FIG. 12) since a modulation characteristic derived through a combination of a frequency gain that is a low pass response passing through the feedback circuit and a frequency gain that is a high pass response passing through the feed-forward circuit can be obtained.

However, even when this two-point modulation method is employed, if a nonlinear VCO 526 is used, a problem arises where a frequency characteristic having a broad band cannot be obtained since distortion occurs in the output due to having a narrow frequency band in which linear modulation can be conducted (FIG. 13). Therefore, it becomes necessary to calibrate the nonlinearity and gain of the VCO 526.

An invention disclosed in Patent Literature 1 exists as one that solves the above described problem. FIG. 14 shows a configuration example of a conventional direct modulation device 511 described in Patent Literature 1.

In FIG. 14, the conventional direct modulation device 511 includes a PLL circuit comprising a VCO 1506, an N-divider (N counter) 1508, a phase comparator, a charge pump (CP), and an RC coupling filter. A phase signal corresponding to a desired channel is converted into a digital modulation signal by a ΔΣ modulator and supplied to the N-divider 1508 and the phase comparator. A step signal ΔfPM is converted into an analog signal by a D/A converter 1510, and then inputted into an auxiliary terminal 1504 of the VCO 1506 via a low pass filter (hereinafter, referred to as LPF) 1512.

In this configuration, the PLL circuit is operated in a closed loop state. First, a desired channel frequency fc is inputted to lock up the VCO 1506 at a division ratio N, and a lock-up voltage Vctrl at that moment is retained [fREF=fC/N]. Next, a step signal ΔfPM is inputted to shift the division ratio of the N-divider 1508 by ΔN. Then, the step signal ΔfPM is adjusted [fREF=(fC+ΔfPM)/(N+ΔN)] such that the lock-up voltage Vctrl at this moment becomes identical to the initial lock-up voltage. The conventional direct modulation device 511 calibrates the nonlinearity and gain of the VCO 1506 by conducting such processes at multiple calibration points.

CITATION LIST

Patent Literature

[PTL 1] Specification of U.S. Pat. No. 7,061,341

SUMMARY OF THE INVENTION

Problems to be Solved by the Invention

However, in the conventional direct modulation device 511 described in the above described Patent Literature 1, the calibration by the VCO 1506 is time-consuming since the PLL circuit is operated in a closed loop state. Therefore, there have been problems where a lock up cannot be conducted in time in some communication systems whose standards have restriction on lock-up times.

Furthermore, since the addition section 525 included in the conventional two-point modulation device 501 shown in FIG. 11 becomes substantially equivalent to a high pass filter (hereinafter, referred to as HPF) (FIG. 15), a DC component in a signal that is to be a high pass response passing through the feed-forward circuit becomes attenuated. Normally, it is necessary to input some sort of a reference signal to a VCO and observe a response therefrom to conduct a calibration of the VCO, and it is preferable to use the feed-forward circuit also as a path for inputting the reference signal in order to suppress an increase of the scale of the circuit. However, due to the reference signal passing through the feed-forward circuit, there are cases where the DC component becomes attenuated and the reference signal inputted into the VCO becomes distorted. As a result, a problem arises where the calibration of the VCO cannot be conducted with fine accuracy.

Therefore, an object of the present invention is to provide a two-point modulation device and a calibration method capable of optimally conducting calibration in a short period of time, by calibrating nonlinearity and gain of a VCO in a state where a feedback circuit is forming an open loop, while suppressing signal distortion caused by an HPF in a feed-forward circuit.

Solution to the Problems

The present invention is directed toward a two-point modulation device using a voltage controlled oscillator. In order to achieve the above described object, a two-point modulation device of the present invention includes: a modulation section including a feedback circuit configured to conduct feedback control of an output signal from the voltage controlled oscillator based on an inputted modulation signal, and a feed-forward circuit configured to calibrate the modulation signal and outputting the calibrated modulation signal to the voltage controlled oscillator; a signal output section configured to output, to the modulation section, a predetermined reference signal instead of the modulation signal when a calibration is conducted; and a gain correction section configured to, in a state where the feedback circuit is forming an open loop, calculate a frequency transition amount of the reference signal outputted by the voltage controlled oscillator, and correct a gain used for calibrating the modulation signal at the feed-forward circuit based on the calculated frequency transition amount. The gain correction section corrects a gain so as to reflect an influence of signal distortion caused by a high pass filter included in the feed-forward circuit.

Representatively, the reference signal is a signal having a pattern that alternately generates, at a pulse width T, rectangular pulses having positive and negative polarity and representing a frequency f. Alternatively, the reference signal is a signal having a pattern that generates at least, at a pulse width T, a pulse having a pulse value 0 and not having frequency information, rectangular pulses having positive and negative polarity and representing a frequency f1, and rectangular pulses having positive and negative polarity and representing a frequency f2 which is different from the frequency f1. In this case, preferably, the frequency f1 is configured as a minimum frequency of a bandwidth obtainable for a channel frequency, and the frequency f2 is configured as a maximum frequency of the bandwidth obtainable for the channel frequency. Furthermore, the reference signal is preferably a signal having a pattern that changes, in an ascending order, from a rectangular pulse having a frequency with a smallest frequency transition amount, to a rectangular pulse having a frequency with a largest frequency transition amount.

Furthermore, by further including a voltage retention section configured to retain a lock-up voltage of the voltage controlled oscillator in a state where the feedback circuit is forming a closed loop, the modulation section can easily set the feedback circuit in an open loop state by fixing a voltage outputted to the voltage controlled oscillator so as to be the lock-up voltage.

Furthermore, the gain correction section preferably calculates respective frequency transition amounts of multiple rectangular pulses forming the reference signal. Particularly preferably, the gain correction section waits until an output of the voltage controlled oscillator stabilizes after the multiple rectangular pulses have risen, and calculates the frequency transition amounts.

Furthermore, a calibration method, which is conducted in a two-point modulation device using a voltage controlled oscillator, is achieved by the steps of: conducting a lock-up of a feedback circuit to conduct a feedback control on an output signal from the voltage controlled oscillator based on an inputted modulation signal; setting the feedback circuit in an open loop state by applying, on the voltage controlled oscillator, a voltage obtained when the lock-up is conducted; outputting a predetermined reference signal to the voltage controlled oscillator via a feed-forward circuit configured to calibrate a modulation signal; and calculating a frequency transition amount of the reference signal outputted by the voltage controlled oscillator, and correcting a gain used to calibrate the modulation signal at the feed-forward circuit based on the calculated frequency transition amount.

Advantageous Effects of the Invention

With the present invention described above, calibration of nonlinearity and gain of a VCO can be properly conducted in a short period of time, since distortion of a reference signal generated by an HPF of a feed-forward circuit is reflected in a corrected gain value of the VCO.

BRIEF DESCRIPTION OF THE DRAWINGS

FIG. 6 shows one example of a table included in a corrected gain retention section 32 in the First Example.

FIG. 9 shows one example of a table included in the corrected gain retention section 32 in the Second Example.

DESCRIPTION OF EMBODIMENTS

<Configuration of a Modulation Device of the Present Invention>

Figure 1:
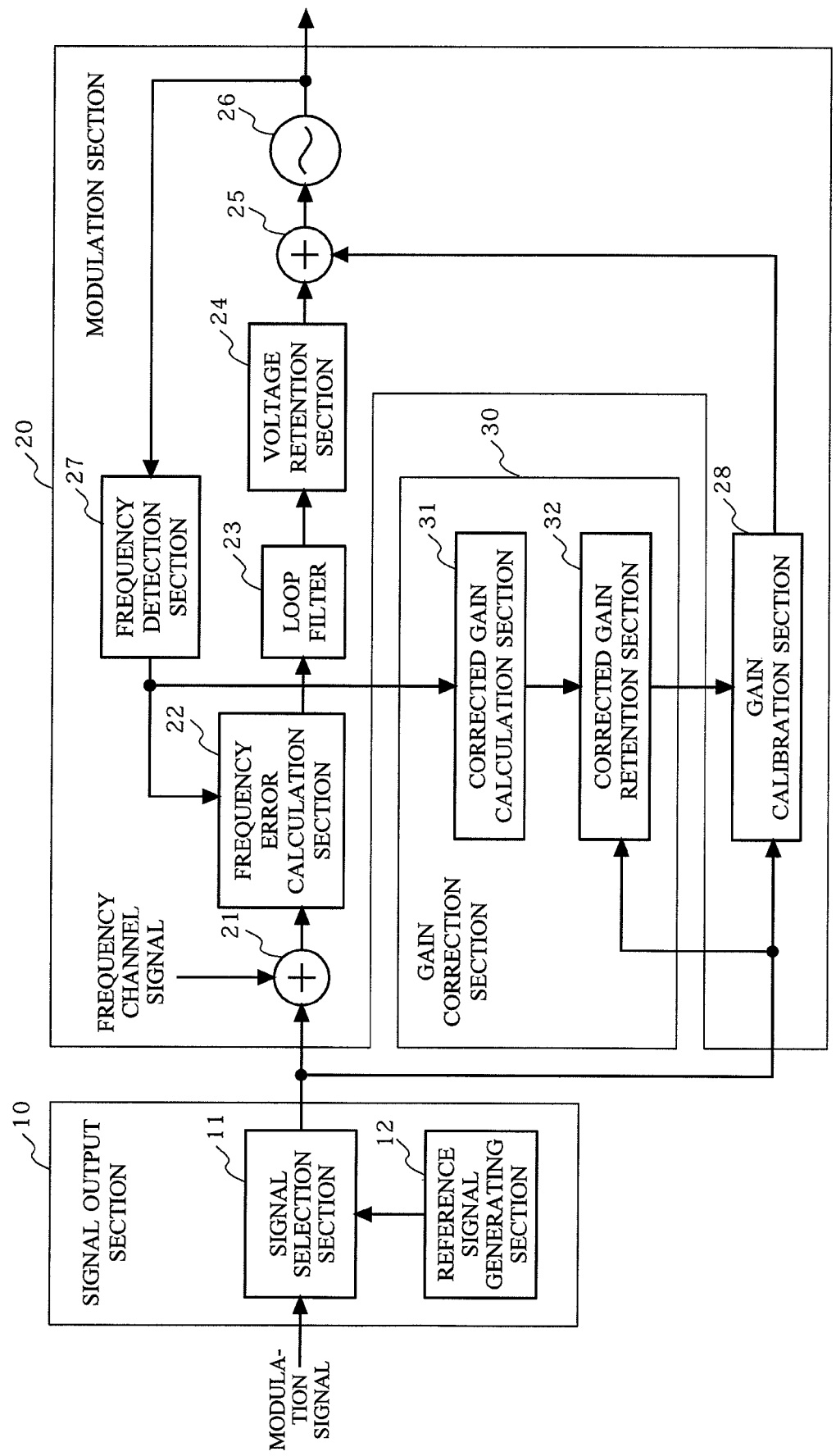
FIG. 1 shows a configuration example of a two-point modulation device 1 according to one embodiment of the present invention.

FIG. 1 shows a configuration example of a two-point modulation device 1 according to one embodiment of the present invention. The two-point modulation device 1 includes a signal output section 10, a modulation section 20, and a gain correction section 30. The signal output section 10 includes a signal selection section 11 and a reference signal generating section 12. The modulation section 20 includes a calculation section 21, a frequency error calculation section 22, a loop filter 23, a voltage retention section 24, an addition section 25, a VCO 26, a frequency detection section 27, and a gain calibration section 28. The gain correction section 30 includes a corrected gain calculation section 31 and a corrected gain retention section 32.

First, outlines of each component of the two-point modulation device 1 will be described.

The reference signal generating section 12 generates a reference signal used when conducting calibration, which is described later. A modulation signal and a reference signal are inputted into the signal selection section 11, and the signal selection section 11 selectively outputs the modulation signal during an ordinarily modulation, and selectively outputs the reference signal during a calibration. For example, a multiplexer is used for the signal selection section 11. A signal outputted from the signal selection section 11 is inputted into the gain calibration section 28 and the calculation section 21 of the modulation section 20.

A signal outputted from the signal selection section 11 and a channel signal having a desired frequency are inputted into the calculation section 21, and the calculation section 21 controls a center frequency of the signal outputted from the signal selection section 11 to be a desired value. By the frequency error calculation section 22, a signal outputted from the calculation section 21 is compared to a frequency signal detected by the frequency detection section 27, and an error signal representing a frequency error between the two signals is calculated. A high frequency side component of the error signal is suppressed by the loop filter 23, and the resulting error signal is outputted to the addition section 25 via the voltage retention section 24. For example, a low pass filter is used for the loop filter 23. If needed, the voltage retention section 24 retains an output signal of the loop filter 23. The VCO 26 outputs a signal having a frequency in accordance with a signal (control voltage) outputted from the addition section 25. The frequency detection section 27 detects the frequency of the signal outputted from the VCO 26, and outputs the detected frequency to the frequency error calculation section 22. For example, a frequency digital converter (FDC) is used for the frequency detection section 27.

A feedback circuit having a low pass response is formed by the frequency error calculation section 22, the loop filter 23, the voltage retention section 24, the addition section 25, the VCO 26, and the frequency detection section 27. Due to this feedback circuit, eventually, an error signal calculated by the frequency error calculation section 22 becomes a value equivalent to zero and thereby the control voltage stabilizes. Then, the VCO 26 outputs a signal having a frequency corresponding to a desired channel signal, and a lock up of the VCO 26 is conducted.

A signal outputted from the signal selection section 11 is inputted into the gain calibration section 28, and the gain calibration section 28 calibrates a gain of the signal outputted from the signal selection section 11 in accordance with a corrected gain value retained by the corrected gain retention section 32. The addition section 25 combines a signal outputted from the voltage retention section 24 and a signal outputted from the gain calibration section 28, and outputs the combined signal to the VCO 26. A feed-forward circuit having a high pass response is formed by the gain calibration section 28, the addition section 25, and the VCO 26.

On the other hand, when a calibration is conducted, the corrected gain calculation section 31 calculates a corrected gain of the VCO 26 by using a frequency detected by the frequency detection section 27. The corrected gain retention section 32 retains a corrected gain calculated by the corrected gain calculation section 31 for every calibrated frequency.

Then, when a modulation is conducted, the gain calibration section 28 calibrates a modulation signal that passes through the feed-forward circuit by using the corrected gain retained by the corrected gain retention section 32.

The characteristic calibration conducted by the two-point modulation device 1 having the above described configuration will be described in the following.

FIRST EXAMPLE

Figure 2:
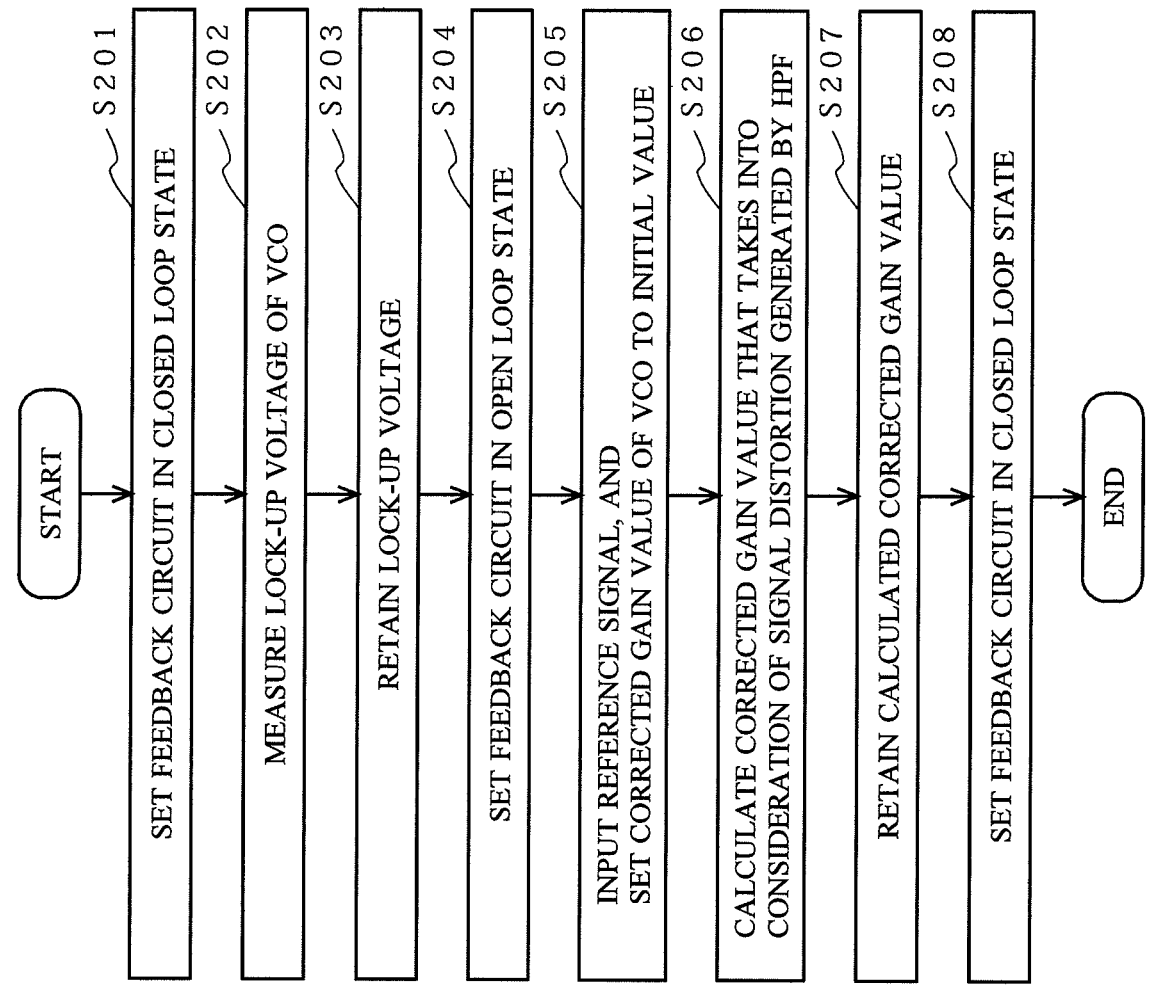
FIG. 2 is a flowchart showing the steps for a calibration conducted by the two-point modulation device 1.

FIG. 2 is a flowchart showing the steps in a First Example for a calibration conducted by the two-point modulation device 1 of the present invention. In this First Example, a method for calibrating a gain of the VCO 26 will be described.

First, the signal selection section 11 selects a mode in which neither of the signals is inputted. A frequency channel signal having a desired frequency fc is inputted into the frequency error calculation section 22, the feedback circuit is set in a closed loop state (step S201), and a lock-up voltage, which is a voltage obtained when a lock-up is conducted on the VCO 26 at a time when there is no modulation signals, is measured (step S202). The lock-up voltage is retained by the voltage retention section 24 (step S203). Then, the feedback circuit is set in an open loop state (step S204) by suspending the loop filter 23 and by statically supplying the lock-up voltage retained by the voltage retention section 24 as a voltage to be outputted to the addition section 25.

Next, when the feedback circuit is set in an open loop state, the signal selection section 11 switches to a mode in which an output of the reference signal generating section 12 is selected (step S205). In addition, the gain calibration section 28 sets the corrected gain value of the VCO 26 to an initial value (step S205). The reference signal generating section 12 generates a reference signal having a pulse pattern shown in FIG. 3, and outputs the reference signal to the corrected gain retention section 32 and the gain calibration section 28.

Figure 3:
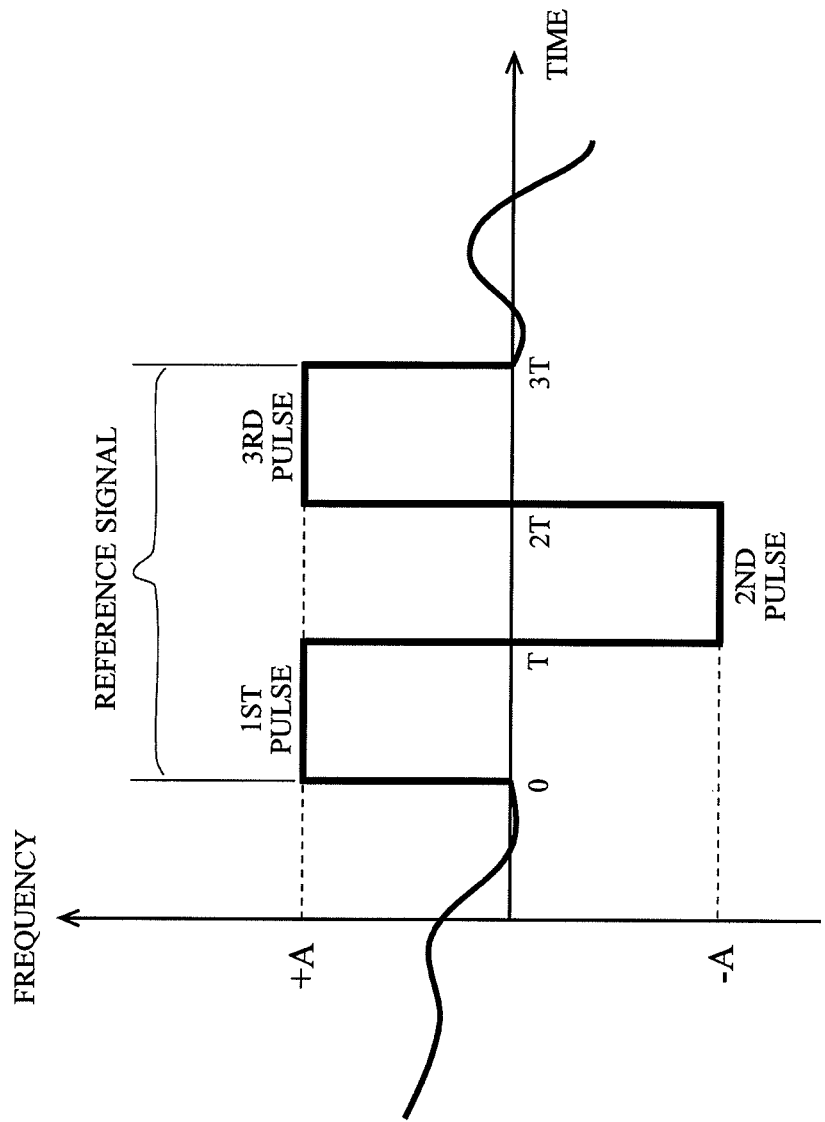
FIG. 3 shows one example of a pulse pattern of a reference signal used in a First Example.

FIG. 3 is for describing the reference signal used in the First Example for measuring the corrected gain value of the VCO 26. The reference signal shown in FIG. 3 includes a first pulse having a positive pulse value +A and representing a frequency f, a second pulse having a negative pulse value −A and representing the frequency f, and a third pulse having the positive pulse value +A. Each pulse width between the first to third pulses is time T. The pulse value A and the pulse width T of the reference signal are set to values that enable the corrected gain calculation section 31 to calculate a corrected gain with sufficient accuracy. For example, if the pulse value A is too small, a transition amount of an output frequency of the VCO 26 becomes smaller than the resolution of the frequency detection section 27. Then, the corrected gain calculation section 31 cannot calculate an accurate corrected gain. On the other hand, if the pulse value A is too large, the corrected gain calculation section 31 cannot calculate an accurate corrected gain due to an influence of the nonlinearity of the VCO 26. Furthermore, if the pulse width T is too small, the corrected gain calculation section 31 cannot sufficiently average-out the output signal of the frequency detection section 27, and consequently cannot calculate an accurate corrected gain due to an influence of noise. On the other hand, if the pulse width T is too large, the corrected gain calculation section 31 spends needless time to calculate the corrected gain.

Figure 4:
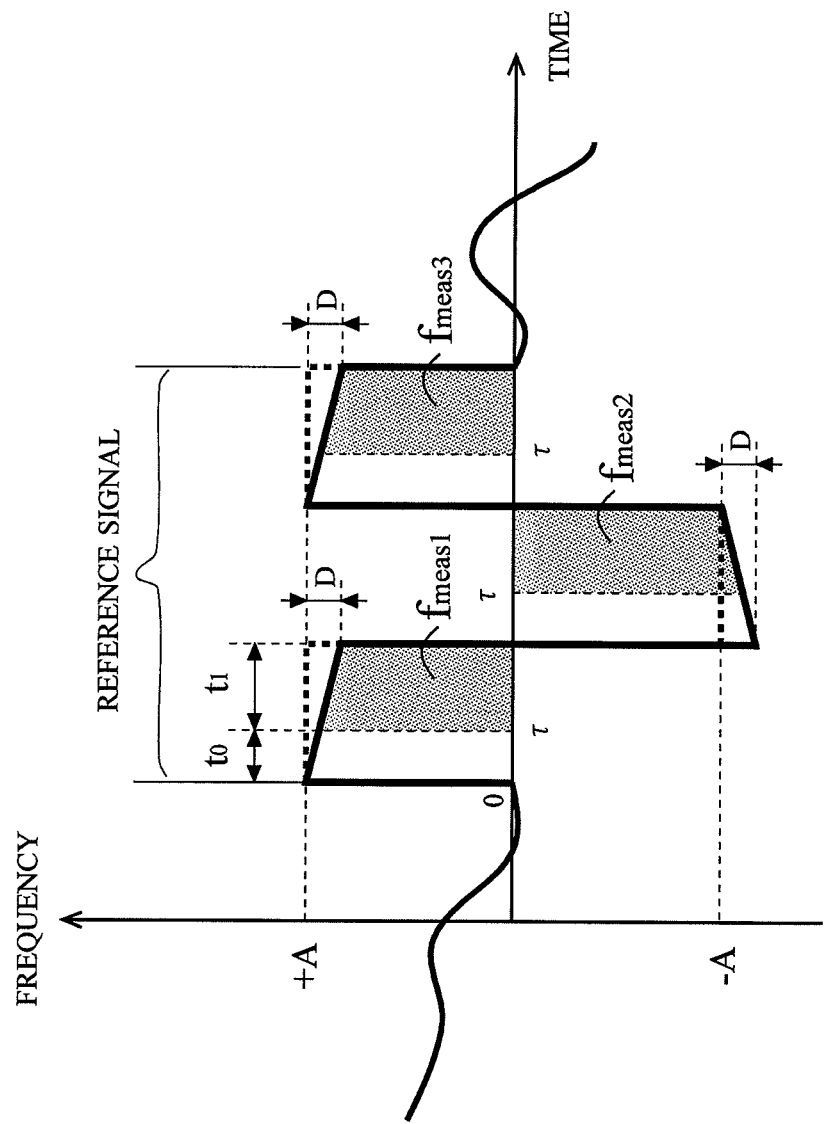
FIG. 4 is for describing an example in which distortion is generated in the pulse pattern of FIG. 3 due to attenuation by an HPF.
Figure 5:
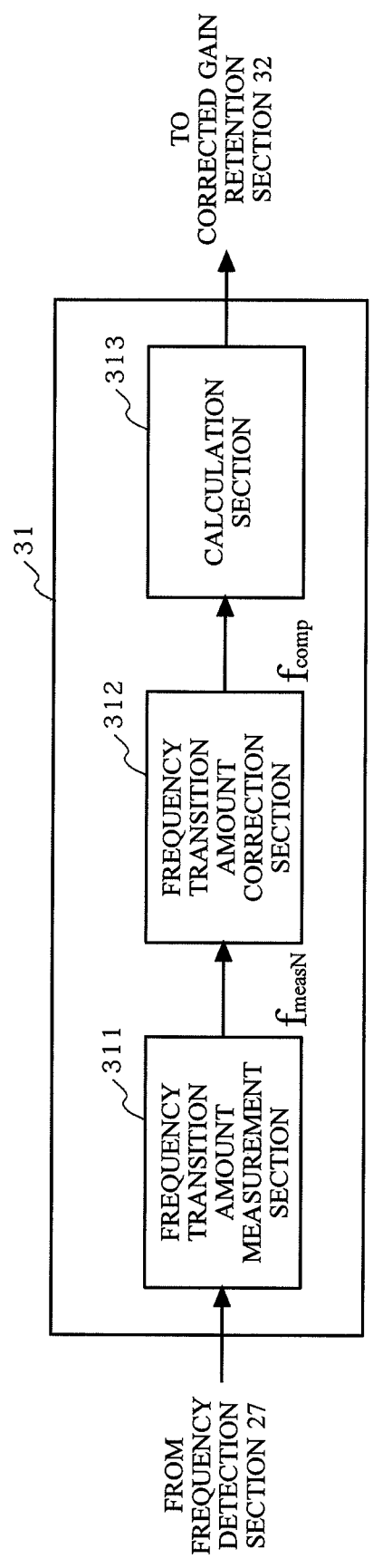
FIG. 5 shows a detailed configuration example of a corrected gain calculation section 31 used in the First Example.

In an ideal two-point modulation device 1, the reference signal shown in FIG. 3 is inputted into the VCO 26 without being changed and is observed by the frequency detection section 27. However, in reality, attenuation occurs at the feed-forward circuit by the HPF, and each pulse value ±A of the first to third pulses of the reference signal observed by the frequency detection section 27 is attenuated to an extent of frequency D as shown in FIG. 4 as a solid line. Therefore, in the First Example, calculation by the corrected gain calculation section 31 is conducted by the following method (step S206). FIG. 5 shows a detailed configuration example of the corrected gain calculation section 31.

A frequency transition amount measurement section 311 measures frequencies for each of the first to third pulses in a period from a time point τ at which a predetermined time t0 has elapsed after a rising point of a pulse, to a falling point of the pulse at which a time t1 has elapsed after the time point τ, and obtains an average frequency transition amount for each of the pulses. The predetermined time t0 is a time period necessary for an output of the VCO 26 to follow-up and stabilize in response to a pulse change, and the length of the time period can be arbitrary configured. to ninth pulses measured by the frequency transition amount measurement section 311.

Figure 15:
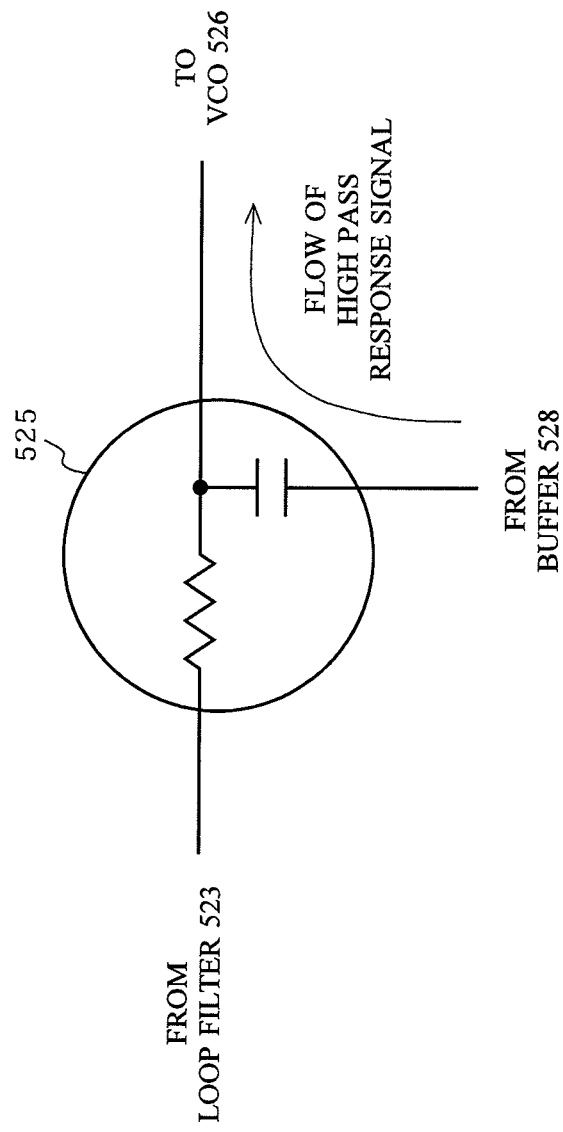
FIG. 15 is for describing an equivalent circuit of an addition section 525 shown in FIG. 11.

When a step-shaped pulse signal having an amplitude A is inputted into an HPF including a capacitor C and a resistance R as shown in FIG. 15, an output $HPF_{out}(t)$ of the HPF can be represented by the following formula [1]. CR is a time constant for the HPF.

[Math. 1]

$$HPF_{out}(t) = Ae^{-\frac{t}{CR}} \quad [1]$$

It can be understood from formula [1] that an amplitude of a reference signal becomes attenuated as time elapses. An attenuation amount D obtained after a pulse width T has elapsed is represented by the following formula [2].

[Math. 2]

$$D = HPF_{out}(T) - HPF_{out}(0) = Ae^{-\frac{T}{CR}} - A = A(e^{-\frac{T}{CR}} - 1) \quad [2]$$

Here, if T<<CR is true, formula [2] can be approximated as the following formula [3].

[Math. 3]

$$D \cong -A\frac{T}{CR} \quad [3]$$

Thus, if the pulse width T is sufficiently smaller than the time constant CR of the HPF, the amount of attenuation by the HPF becomes proportional to the pulse width T.

Therefore, in FIG. 4, for the first pulse, the frequency at the time point when the predetermined time t0 has elapsed after the rising point of the pulse is +A−τD, and the frequency at the falling point T of the pulse is +A−D. Here, τ=t0/(t0+t1) is true. Therefore, a frequency transition amount $f_{meas1}$ of the first pulse is represented by the following formula [4].

[Math. 4]

$$f_{meas1} = \frac{(+A - \tau D) + (+A - D)}{2} = +A - \frac{1+\tau}{2}D \quad [4]$$

Similarly, for the second pulse, the frequency at a time point τ is −A−D+τD, and the frequency at a falling point 2T of the pulse is −A. Therefore, a frequency transition amount $f_{meas2}$ of the second pulse is represented by the following formula [5].

[Math. 5]

$$f_{meas2} = \frac{(-A - D + \tau D) + (-A)}{2} = -A - \frac{1-\tau}{2}D \quad [5]$$

A frequency transition amount $f_{meas3}$ for the third pulse is identical to that of the first pulse, and is represented by the following formula [6].

[Math. 6]

$$f_{meas3} = \frac{(+A - \tau D) + (+A - D)}{2} = +A - \frac{1+\tau}{2}D \quad [6]$$

Then, by using the frequency transition amounts $f_{meas1}$ to $f_{meas3}$ of the first to third pulses measured by the frequency transition amount measurement section 311, a frequency transition amount correction section 312 obtains a frequency transition amount $f_{comp}$ of a reference signal that is subjected to distortion by the HPF from the following formula [7].

[Math. 7]

$$f_{comp} = \frac{f_{meas1} - 2 \cdot f_{meas2} + f_{meas3}}{4} \quad [7]$$

It can be understood that by conducting the designing such that 1>>τ and 1>>D/A are satisfied, the above described formula [7] becomes $f_{comp}=A$, and a signal distortion (D) by the HPF can be cancelled. It should be noted that the frequency D is determined by the time constant CR of the high pass filter.

Lastly, based on the frequency transition amount $f_{comp}$ and a frequency transition amount $f_{ref}$ of the reference signal outputted by the reference signal generating section 12, a calculation section 313 obtains, from the following formula [8], a corrected gain value G for calibrating the gain of the VCO 26, which takes into consideration of the signal distortion by the HPF.

[Math. 8]

$$G = \frac{f_{ref}}{|f_{comp}|} \quad [8]$$

The obtained corrected gain value G of the VCO 26 is retained in the corrected gain retention section 32 (step S207). When there are multiple frequencies ($f_a$, $f_b$, ...) for a channel signal used in the two-point modulation device 1, a corrected gain value G of the VCO 26 is obtained for each of the multiple channel frequencies. FIG. 6 shows one example of a table included in the corrected gain retention section 32 of the First Example. It should be noted that the table may retain each corrected gain value G for multiple channel frequencies as shown in FIG. 6, or may retain a single corrected gain value G and a calibration may be conducted on this corrected gain value G every time the channel frequency is locked to respective channel frequencies. In the latter case, the scale of the circuit can be reduced when compared to the former case. Furthermore, since fluctuation due to changes caused by temperature and aging occur in a course of a long time period when compared to the time in which a communication is conducted by a communication system, it is not always necessary to conduct a calibration every time a frequency is locked, and the corrected gain value G may be calibrated at a certain time interval. As a result, power consumption can be reduced, and a lock-up time can be shortened in the cases where a calibration is not conducted.

With this, the calibration ends; and the signal selection section 11 switches to a mode in which the modulation signal is selected, and the feedback circuit changes the output from the voltage retention section 24 to the output from the loop filter 23 and returns to the closed loop state (step S208). When a modulation is conducted, the corrected gain retention section 32 determines the frequency of a modulation signal and outputs, to the gain calibration section 28, a corrected gain value G of the VCO 26 corresponding to the determined frequency.

As described above, according to the First Example, the average value of the frequency transition amounts of each of the pulses forming the reference signal is reflected to the corrected gain value. As a result, even if an HPF is inserted in the feed-forward circuit equivalently, calibration of the gain of the VCO 26 can be appropriately conducted.

Described in the First Example is a reference signal in which the first pulse having a pulse value +A, a second pulse having a pulse value −A, and a third pulse having a pulse value +A, are each generated at a period T. However, the reference signal is not limited to the pulse pattern described in this First Example, and the order and number of pulses may be freely configured as long as the pulse pattern is one in which a pulse having a pulse value +A and a pulse having a pulse value −A are alternately generated at a pulse width T.

SECOND EXAMPLE

In a Second Example, a method for calibrating the nonlinearity and gain of the VCO 26 will be described. In the Second Example, although the steps for the calibration conducted by the two-point modulation device 1 of the present invention is basically similarly to the steps shown in FIG. 2, a process at step S206 is different. In the following, the description of the Second Example will center on the process at step S206.

Figure 7:
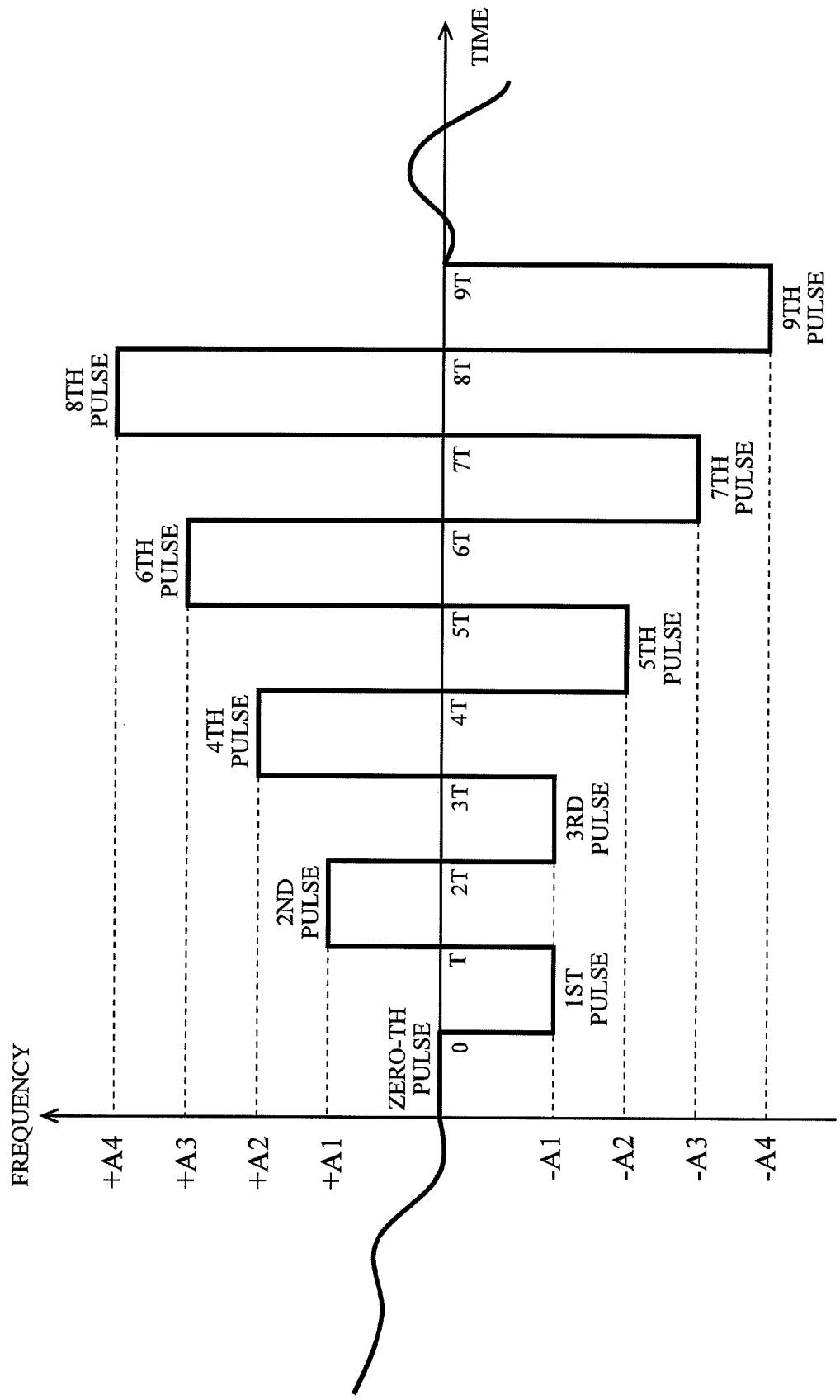
FIG. 7 shows one example of a pulse pattern of a reference signal used in a Second Example.

When an initial value of the corrected gain value is set to the gain calibration section 28 (step S205), the reference signal generating section 12 generates a reference signal having a pulse pattern as shown in FIG. 7, and outputs the reference signal to the corrected gain retention section 32 and the gain calibration section 28. FIG. 7 is for describing the reference signal used in the Second Example for measuring the corrected gain value of the VCO 26.

The reference signal shown in FIG. 7 includes a zero-th pulse that is a null-signal and in which frequency information is not outputted, a first pulse having a negative pulse value −A1 and representing a frequency f1, a second pulse having a positive pulse value +A1 and representing the frequency f1, a third pulse having the negative pulse value −A1, a fourth pulse having a positive pulse value +A2 and representing a frequency f2, a fifth pulse having a negative pulse value −A2 and representing the frequency f2, a sixth pulse having a positive pulse value +A3 and representing a frequency f3, and a seventh pulse having a negative pulse value −A3 and representing the frequency f3, an eighth pulse having a positive pulse value +A4 and representing a frequency f4, and a ninth pulse having a negative pulse value −A4 and representing the frequency f4. Each pulse width between the zero-th to ninth pulses is time T.

Figure 8:
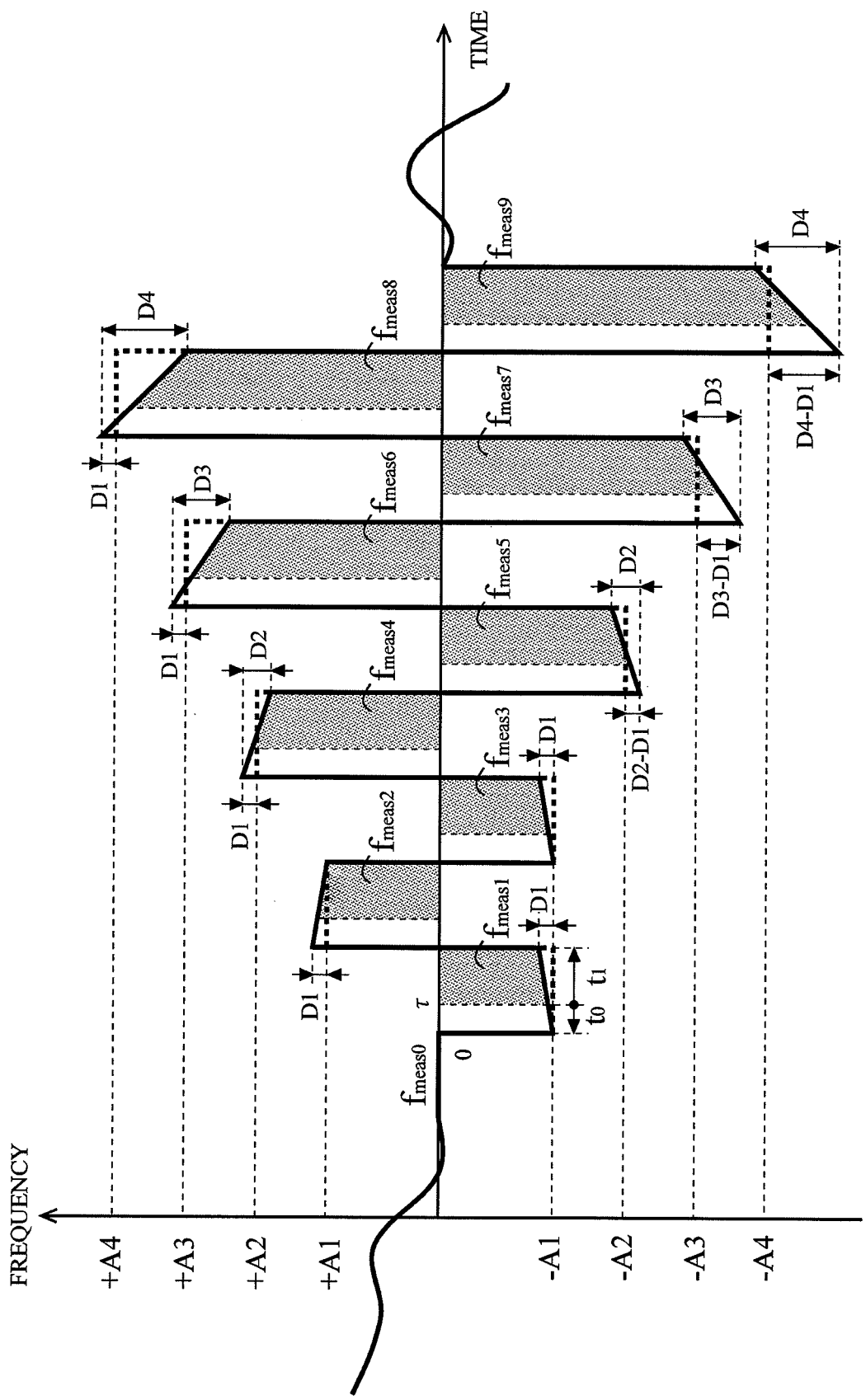
FIG. 8 is for describing an example in which distortion is generated in the pulse pattern of FIG. 7 due to attenuation by an HPF.

With respect to each of the pulse values of the zero-th to ninth pulses of the reference signals observed by the frequency detection section 27, as a result of attenuation caused by the HPF in the feed-forward circuit, frequencies ±A1 are attenuated (drifted) to an extent of frequency D1, frequencies ±A2 are attenuated (drifted) to an extent of frequency D2, frequencies ±A3 are attenuated (drifted) to an extent of frequency D3, and frequencies ±A4 are attenuated (drifted) to an extent of frequency D4, as described above and shown with solid lines in FIG. 8. Therefore, in the Second Example, calculation by the corrected gain calculation section 31 is conducted by the following method (step S206).

With the method described in the First Example, the frequency transition amount measurement section 311 measures, for each of the zero-th to ninth pulses, frequencies at two points, which are a time point τ at which a predetermined time t0 has elapsed after a rising point of a pulse and a falling point of the pulse at which a time t1 has elapses after the time point τ; and obtains frequency transition amounts for each of the pulses. The frequency transition amounts $f_{meas0}$ to $f_{meas9}$ of the zero-th to ninth pulses are represented respectively by the following formulae [9] to [18].

[Math. 9]

$$f_{meas0} = 0 \qquad [9]$$

[Math. 10]

$$f_{meas1} = -A1 + \frac{1+\tau}{2}D1 \qquad [10]$$

[Math. 11]

$$f_{meas2} = +A1 + \frac{1-\tau}{2}D1 \qquad [11]$$

[Math. 12]

$$f_{meas3} = -A1 + \frac{1+\tau}{2}D1 \qquad [12]$$

[Math. 13]

$$f_{meas4} = +A2 + D1 - \frac{1+\tau}{2}D2 \qquad [13]$$

[Math. 14]

$$f_{meas5} = -A2 + D1 - \frac{1-\tau}{2}D2 \qquad [14]$$

[Math. 15]

$$f_{meas6} = +A3 + D1 - \frac{1+\tau}{2}D3 \qquad [15]$$

[Math. 16]

$$f_{meas7} = -A3 + D1 - \frac{1-\tau}{2}D3 \qquad [16]$$

[Math. 17]

$$f_{meas8} = +A4 + D1 - \frac{1+\tau}{2}D4 \qquad [17]$$

[Math. 18]

$$f_{meas9} = -A4 + D1 - \frac{1-\tau}{2}D4 \quad [18]$$

Furthermore, when a relationship of $Dn=|\pm An|\times(t0+t1)/RC$ (n=1,2,3,4) is used, and if $A2=4\times A1$, $A3=8\times A1$, and $A4=16\times A1$ are true, the frequency transition amounts $f_{meas1}$ to $f_{meas9}$ of the first to ninth pulses shown by formulae [10] to [18] are respectively represented by the following formulae [19] to [27].

[Math. 19]

$$f_{meas1} = A1 \cdot \left(1 - \frac{1+\tau}{2} \cdot \frac{t_0+t_1}{RC}\right) \quad [19]$$

[Math. 20]

$$f_{meas2} = A1 \cdot \left(1 + \frac{1-\tau}{2} \cdot \frac{t_0+t_1}{RC}\right) \quad [20]$$

[Math. 21]

$$f_{meas3} = A1 \cdot \left(1 - \frac{1+\tau}{2} \cdot \frac{t_0+t_1}{RC}\right) \quad [21]$$

[Math. 22]

$$f_{meas4} = A1 \cdot \left(1 - \frac{1+2\tau}{4} \cdot \frac{t_0+t_1}{RC}\right) \quad [22]$$

[Math. 23]

$$f_{meas5} = A1 \cdot \left(1 + \frac{1-2\tau}{4} \cdot \frac{t_0+t_1}{RC}\right) \quad [23]$$

[Math. 24]

$$f_{meas6} = A1 \cdot \left(1 - \frac{3+4\tau}{8} \cdot \frac{t_0+t_1}{RC}\right) \quad [24]$$

[Math. 25]

$$f_{meas7} = A1 \cdot \left(1 + \frac{3-4\tau}{8} \cdot \frac{t_0+t_1}{RC}\right) \quad [25]$$

[Math. 26]

$$f_{meas8} = A1 \cdot \left(1 - \frac{7+8\tau}{16} \cdot \frac{t_0+t_1}{RC}\right) \quad [26]$$

[Math. 27]

$$f_{meas9} = A1 \cdot \left(1 + \frac{7-8\tau}{16} \cdot \frac{t_0+t_1}{RC}\right) \quad [27]$$

Here, if the values of time t0 and time t1 are set such that $1 \gg \tau$ is true, the calculation for obtaining the frequency transition amounts $f_{meas1}$ to $f_{meas9}$ can be simplified, since the second term which includes $\tau$ and which is in the right-hand side parenthesis can be ignored. In order to simplify the description, the second term is substituted with "$e_N$," and the frequency transition amounts $f_{meas1}$ to $f_{meas9}$ of the first to ninth pulses are all represented in a form shown in the following formula [28].

[Math. 28]

$$f_{measN} = A1 \cdot (1+e_N)(N=1\sim9) \quad [28]$$

Based on this, from the following formula [29], the frequency transition amount correction section 312 obtains respective frequency transition amounts $f_{comp}$ in the reference signal subjected to distortion, by using the frequency transition amounts $f_{meas1}$ to $f_{meas9}$ of the first to ninth pulses measured by the frequency transition amount measurement section 311.

[Math. 29]

$$f_{compN} = \frac{f_{measN}}{1+e_N} (N=1\sim9) \quad [29]$$

Then, the calculation section 313 obtains a corrected gain value G for every frequency to calibrate the nonlinearity and gain of the VCO 26 by using formula [30], based on each frequency transition amounts $f_{comp}$ and the frequency transition amount $f_{ref}$ of the reference signal outputted from the reference signal generating section 12. Representatively, the frequency transition amounts $f_{comp1}$ to $f_{comp3}$ of the first to third pulses are used for calibrating the gain of the VCO 26, and the frequency transition amounts $f_{comp2}$ to $f_{comp9}$ of the second to ninth pulses are used for calibrating the nonlinearity of the VCO 26.

[Math. 30]

$$G_N = \frac{f_{refN}}{|f_{compN}|} (N=1\sim9) \quad [30]$$

The obtained corrected gain value G of the VCO 26 is retained in the corrected gain retention section 32 (step S207). When there are multiple frequencies ($f_a$, $f_b$, ...) for a channel signal used in the two-point modulation device 1, a corrected gain value G of the VCO 26 is obtained for each of the multiple channel frequencies. FIG. 9 shows one example of a table included in the corrected gain retention section 32 of the Second Example. It should be noted that, as the corrected gain value G, other than retaining all the values corresponding to all the pulse values $\pm A1$, $\pm A2$, $\pm A3$, and $\pm A4$ shown in FIG. 9, an average value of positive polarity +A and negative polarity −A may be retained.

As described above, according to the Second Example, the frequency transition amounts of each of the pulses forming the reference signal is reflected to the corrected gain value. As a result, even if an HPF is inserted in the feed-forward circuit equivalently, calibration of the nonlinearity and gain of the VCO 26 can be appropriately conducted.

In the Second Example, a reference signal having four rectangular pulses with pulse values of $\pm A1$, $\pm A2$, $\pm A3$, and $\pm A4$ are used for calibrating the nonlinearity of the VCO 26. However, the calibration of the nonlinearity of the VCO 26 can be conducted by calculating a corrected gain value for frequencies of at least two points in a frequency band (which, in the Second Example, corresponds to the frequency bandwidth of the modulation signal in which the pulse values range from −A4 to +A4) of the modulation signal. When a frequency spectrum of a modulation signal is observed, generally, many components are often included in the vicinity of DC (vicinity of the channel frequency when observed at an RF band). Therefore, the nonlinearity of the VCO 26 can be accurately calibrated by simply calculating corrected gain values for the frequencies at both ends (pulse values −A4 and +A4 in the Second Example) and in the middle (pulse values $\pm A1$ in the Second Example) of the bandwidth of the modulation signal. In this case, the pulse values $\pm A1$ are sufficient if they have a frequency transition amount equal to or greater than the minimum resolution of the frequency detection section 27. Furthermore, the nonlinearity can be calibrated more accurately by calculating corrected gain values for other frequencies in the frequency band of the modulation signal.

Figure 13:
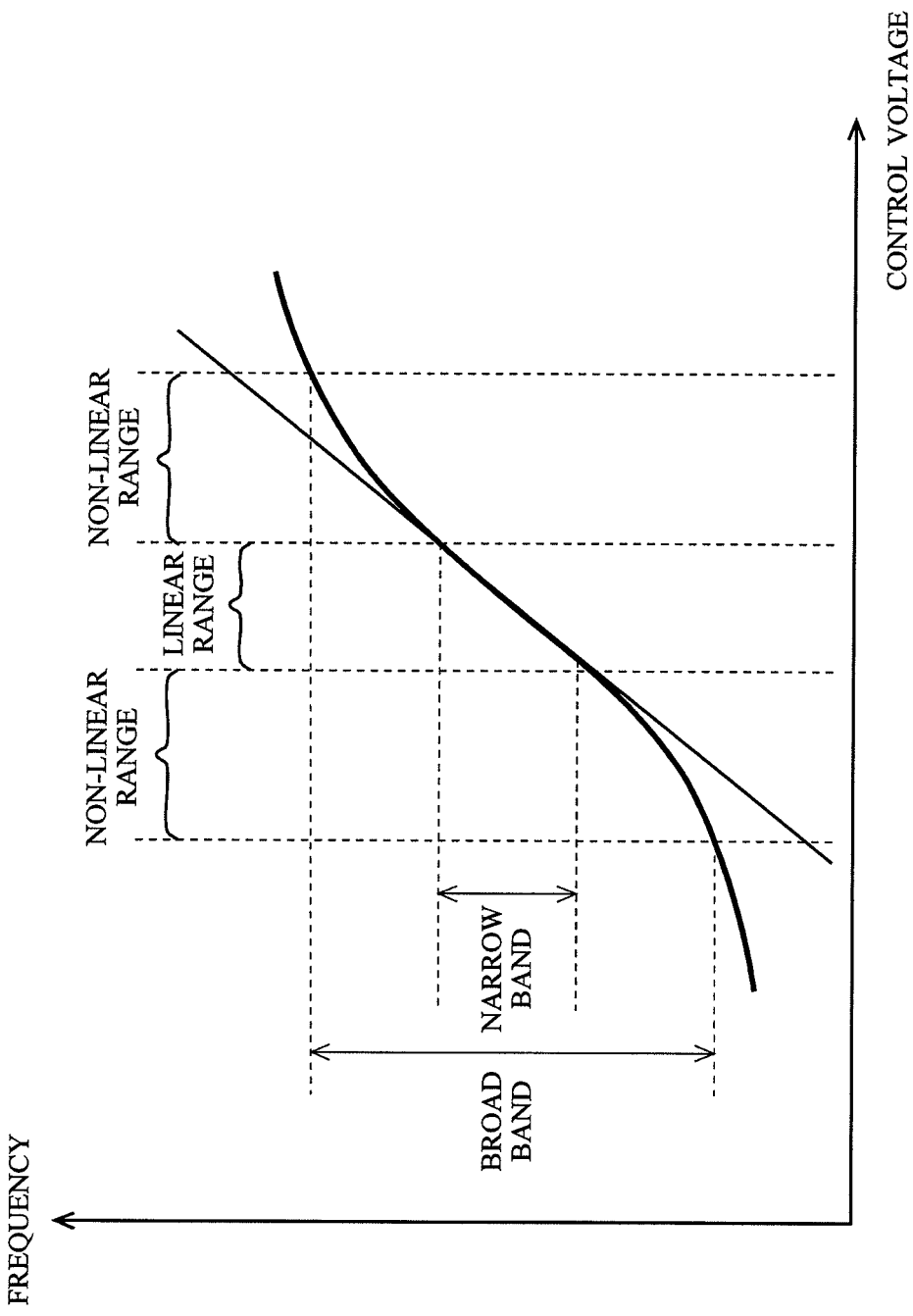
FIG. 13 is for describing frequency characteristics of a nonlinear VCO.
Figure 14:
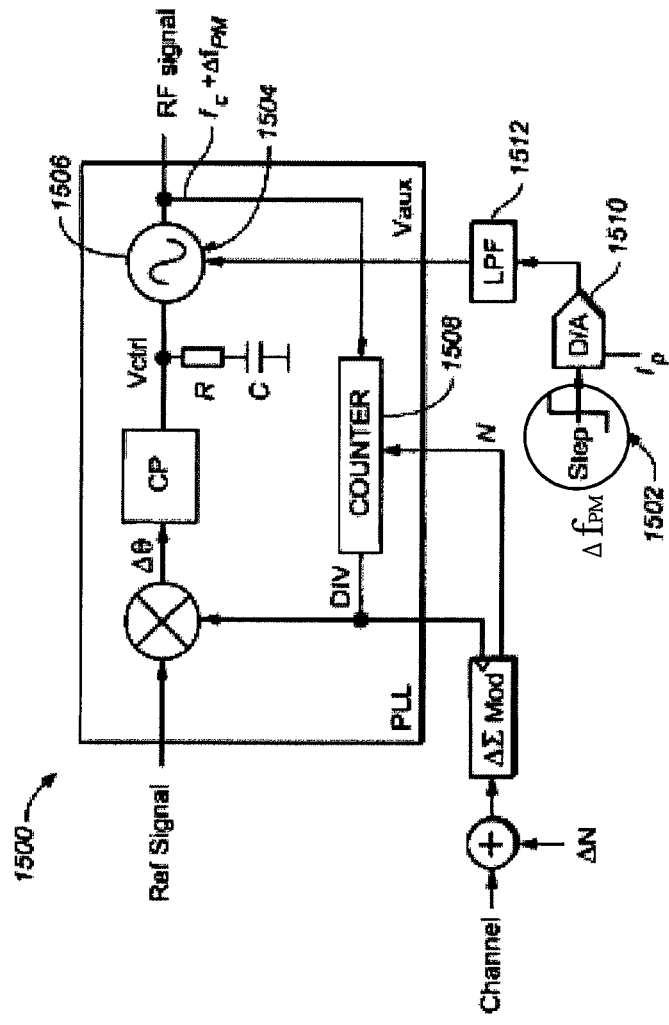
FIG. 14 shows a configuration example of a conventional direct modulation device 511.

In the First Example, through calibration, a corrected gain value for a single point is obtained, and in the Second Example, corrected gain values for multiple points are obtained. The number of corrected gain values that should be obtained is determined based on the bandwidth of the modulation signal and the nonlinearity of the VCO 26. In FIG. 13, when the linear range of the VCO 26 is larger than the bandwidth of the modulation signal, the corrected gain value may be obtained at a single point. Conversely, when the linear range of the VCO 26 is smaller the bandwidth of the modulation signal, multiple corrected gain values are necessary.

Furthermore, in order to improve the accuracy of the calibration, the multiple pulses included in the reference signal preferably change in a pattern in an ascending order from a rectangular pulse having a frequency with the smallest frequency transition amount (in this Example, pulse value ±A1) to a rectangular pulse having a frequency with the largest frequency transition amount (in this Example, pulse value ±A4), as shown in FIG. 7.

In the Second Example, although the pulse width T is constant for all the reference signals, the pulse width T may be changed depending a pulse value. As described above, the pulse width of the reference signal is determined depending on how much the influence of noise is to be lessened through averaging. If an S/N ratio of an average frequency transition amount measured by the corrected gain calculation section 31 is expected to be constant, the pulse width may be reduced, since the influence of noise becomes relatively small as a pulse value of the reference signal becomes large. For example, when a pulse width of a reference signal with a pulse value ±A1 is defined as T, a pulse width of a reference signal with a pulse value A2 (=2×A1) can be set to T/2. With this, the lock-up time can be shortened.

THIRD EXAMPLE

In a Third Example, a method (predistortion) for pre-reflecting, to a reference signal, the frequency transition amount $f_{comp}$ obtained by the frequency transition amount correction section 312 in the Second Example will be described.

Figure 10:
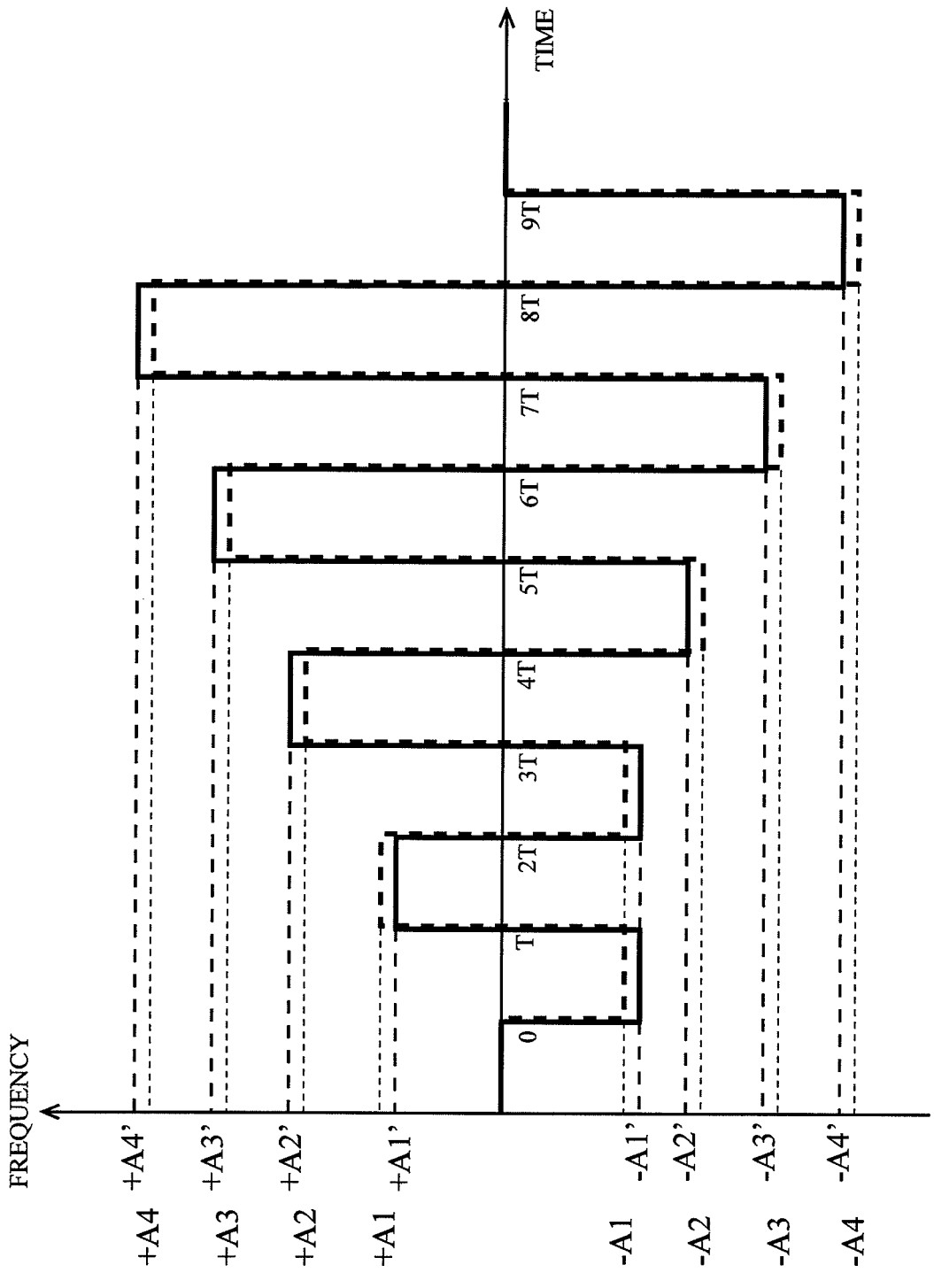
FIG. 10 shows one example of a pulse pattern of a reference signal used in a Third Example.
Figure 11:
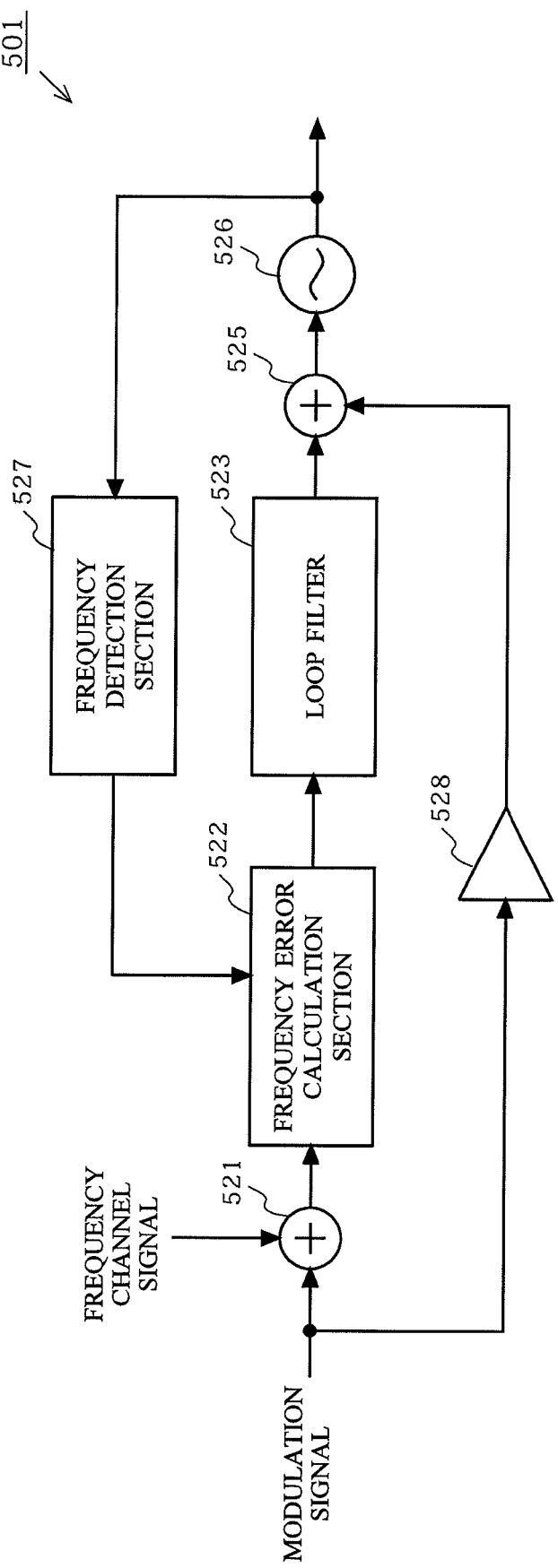
FIG. 11 shows a configuration example of a conventional two-point modulation device 501.
Figure 12:
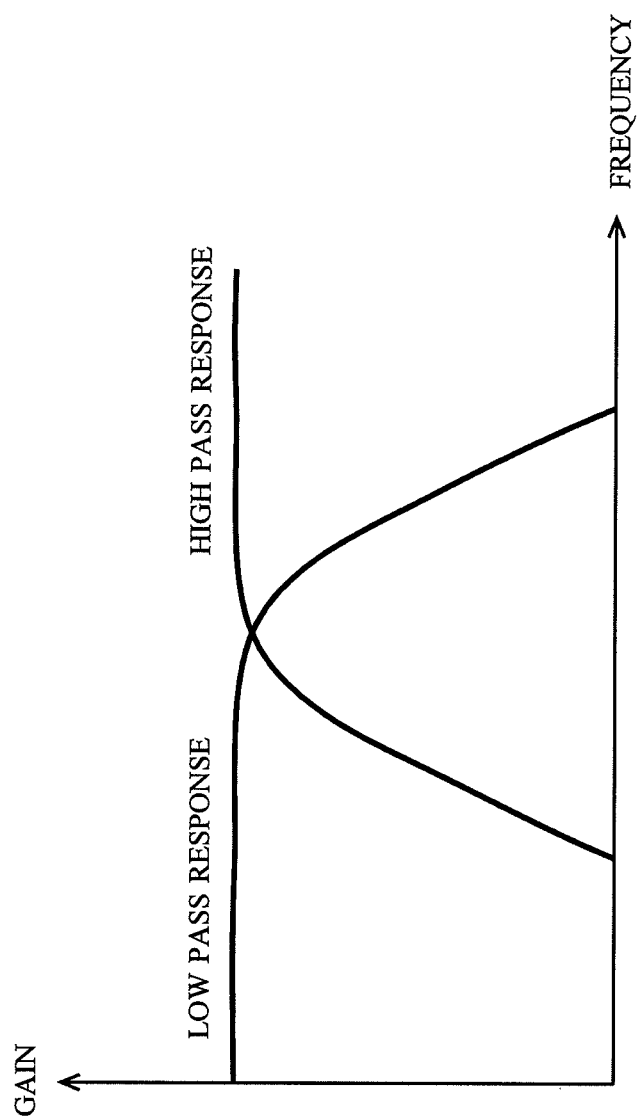
FIG. 12 is for describing that broadening of a bandwidth can be achieved in a modulation device that utilizes a two-point modulation method.

It has become obvious from the above described formula [28] that the reference signal outputted from the reference signal generating section 12 is measured at the frequency detection section 27 as a signal multiplied by a coefficient $(1+e_N)$. Therefore, a reference signal, in which a pulse value An is substituted with a pulse value An' obtained by dividing the pulse value An with the coefficient $(1+e_N)$, is outputted in advance from the reference signal generating section 12. Pulse values ±A1', ±A2', ±A3', and ±A4' are represented by the following formulae [31] to [38]. FIG. 10 is for describing the reference signal used in the Third Example.

[Math. 31]
$$+A1' = \frac{+A1}{1 - \frac{1+\tau}{2} \cdot \frac{t_0 + t_1}{RC}} \quad [31]$$

[Math. 32]
$$-A1' = \frac{-A1}{1 + \frac{1-\tau}{2} \cdot \frac{t_0 + t_1}{RC}} \quad [32]$$

[Math. 33]
$$+A2' = \frac{+A2}{1 + \frac{1+2\tau}{4} \cdot \frac{t_0 + t_1}{RC}} \quad [33]$$

[Math. 34]
$$-A2' = \frac{-A2}{1 + \frac{1-2\tau}{4} \cdot \frac{t_0 + t_1}{RC}} \quad [34]$$

[Math. 35]
$$+A3' = \frac{+A3}{1 - \frac{3+4\tau}{8} \cdot \frac{t_0 + t_1}{RC}} \quad [35]$$

[Math. 36]
$$-A3' = \frac{-A3}{1 + \frac{3-4\tau}{8} \cdot \frac{t_0 + t_1}{RC}} \quad [36]$$

[Math. 37]
$$+A4' = \frac{+A4}{1 - \frac{7+8\tau}{16} \cdot \frac{t_0 + t_1}{RC}} \quad [37]$$

[Math. 38]
$$-A4' = \frac{-A4}{1 + \frac{7-8\tau}{16} \cdot \frac{t_0 + t_1}{RC}} \quad [38]$$

As described above, according to the Third Example, the frequency transition amount $f_{comp}$ that the frequency transition amount correction section 312 would obtain is reflected in the reference signal in advance. As a result, the configuration for the frequency transition amount correction section 312 can be omitted, and a load for the processing conducted by the frequency transition amount correction section 312 is eliminated and consequently the calibration can be executed at a high speed.

Industrial Applicability

The present invention is applicable to a wireless radio or the like having a two-point modulation device that uses a VCO; and is particularly useful for cases such as when calibrating nonlinearity and gain of a VCO to take into consideration of a signal distortion generated by an HPF in a feedforward circuit.

DESCRIPTION OF THE REFERENCE CHARACTERS

1, 501 two-point modulation device
10 signal output section
11 signal selection section
12 reference signal generating section
20 modulation section
21, 313, 521 calculation section
22, 522 frequency error calculation section
23, 523 loop filter
24 voltage retention section 25, 525 addition section
26, 526 VCO
27, 527 frequency detection section
28 gain calibration section
30 gain correction section
31 corrected gain calculation section
32 corrected gain retention section
311 frequency transition amount measurement section
312 frequency transition amount correction section

The invention claimed is:

1. A two-point modulation device using a voltage controlled oscillator, the two-point modulation device comprising:
    a modulation section including a feedback circuit configured to conduct feedback control of an output signal from the voltage controlled oscillator based on an inputted modulation signal, and a feed-forward circuit configured to calibrate the modulation signal and outputting the calibrated modulation signal to the voltage controlled oscillator;
    a signal output section configured to output, to the modulation section, a predetermined reference signal instead of the modulation signal when a calibration is conducted; and
    a gain correction section configured to, in a state where the feedback circuit is forming an open loop, calculate a frequency transition amount of the reference signal outputted by the voltage controlled oscillator, and correct a gain used for calibrating the modulation signal at the feed-forward circuit based on the calculated frequency transition amount.

2. The two-point modulation device according to claim 1, wherein the reference signal is a signal having a pattern that alternately generates, at a pulse width T, a rectangular pulse having a positive polarity and representing a frequency f, and a rectangular pulse having a negative polarity and representing the frequency f.

3. The two-point modulation device according to claim 1, wherein the reference signal is a signal having a pattern that generates at least, at a pulse width T, a pulse having a pulse value 0 and not having frequency information, a rectangular pulse having a positive polarity and representing a frequency f1, a rectangular pulse having a negative polarity and representing the frequency f1, a rectangular pulse having a positive polarity and representing a frequency f2 that is different from the frequency f1, and a rectangular pulse having a negative polarity and representing the frequency f2.

4. The two-point modulation device according to claim 3, wherein the frequency f1 is a minimum frequency of a bandwidth obtainable for a channel frequency, and the frequency f2 is a maximum frequency of the bandwidth obtainable for the channel frequency.

5. The two-point modulation device according to claim 3, wherein the reference signal is a signal having a pattern that changes, in an ascending order, from a rectangular pulse having a frequency with a smallest frequency transition amount, to a rectangular pulse having a frequency with a largest frequency transition amount.

6. The two-point modulation device according to claim 1, further comprising a voltage retention section configured to retain a lock-up voltage of the voltage controlled oscillator in a state where the feedback circuit is forming a closed loop, wherein
    the modulation section sets the feedback circuit in an open loop state by fixing a voltage outputted to the voltage controlled oscillator so as to be the lock-up voltage.

7. The two-point modulation device according to claim 2, wherein the gain correction section calculates respective frequency transition amounts of multiple rectangular pulses forming the reference signal.

8. The two-point modulation device according to claim 3, wherein the gain correction section calculates respective frequency transition amounts of multiple rectangular pulses forming the reference signal.

9. The two-point modulation device according to claim 7, wherein the gain correction section waits until an output of the voltage controlled oscillator stabilizes after the multiple rectangular pulses have risen, and calculates the frequency transition amounts.

10. The two-point modulation device according to claim 8, wherein the gain correction section waits until an output of the voltage controlled oscillator stabilizes after the multiple rectangular pulses have risen, and calculates the frequency transition amounts.

11. The two-point modulation device according to claim 1, wherein the gain correction section corrects a gain so as to reflect an influence of signal distortion caused by a high pass filter included in the feed-forward circuit.

12. A calibration method conducted in a two-point modulation device using a voltage controlled oscillator, the method comprising the steps of:
    conducting a lock-up of a feedback circuit to conduct a feedback control on an output signal from the voltage controlled oscillator based on an inputted modulation signal;
    setting the feedback circuit in an open loop state through application of, on the voltage controlled oscillator, a voltage obtained when the lock-up is conducted;
    outputting a predetermined reference signal to the voltage controlled oscillator via a feed-forward circuit configured to calibrate a modulation signal; and
    calculating a frequency transition amount of the reference signal outputted by the voltage controlled oscillator, and correcting a gain used to calibrate the modulation signal at the feed-forward circuit based on the calculated frequency transition amount.

* * * * *